United States Patent
Cox et al.

(10) Patent No.: US 7,456,935 B2
(45) Date of Patent: Nov. 25, 2008

(54) LITHOGRAPHIC APPARATUS AND DEVICE MANUFACTURING METHOD UTILIZING A POSITIONING DEVICE FOR POSITIONING AN OBJECT TABLE

(75) Inventors: Henrikus Herman Marie Cox, Eindhoven (NL); Sven Antoin Johan Hol, Eindhoven (NL); Petrus Matthijs Henricus Vosters, Bladel (NL)

(73) Assignee: ASML Netherlands B.V., Veldhoven (NL)

( * ) Notice: Subject to any disclaimer, the term of this patent is extended or adjusted under 35 U.S.C. 154(b) by 309 days.

(21) Appl. No.: 11/098,608

(22) Filed: Apr. 5, 2005

(65) Prior Publication Data

US 2006/0221323 A1    Oct. 5, 2006

(51) Int. Cl.
*G03B 27/58* (2006.01)
*G03B 27/42* (2006.01)

(52) U.S. Cl. .......................................... 355/72; 355/53
(58) Field of Classification Search ................... 355/53, 355/72–76; 310/10, 12; 318/135, 632
See application file for complete search history.

(56) References Cited

U.S. PATENT DOCUMENTS

| | | | |
|---|---|---|---|
| 5,229,872 A | | 7/1993 | Mumola |
| 5,296,891 A | | 3/1994 | Vogt et al. |
| 5,523,193 A | | 6/1996 | Nelson |
| 5,939,852 A | * | 8/1999 | Akutsu et al. ............... 318/640 |
| 6,133,986 A | | 10/2000 | Johnson |
| 6,285,097 B1 | * | 9/2001 | Hazelton et al. .............. 310/12 |
| 6,449,030 B1 | * | 9/2002 | Kwan ........................... 355/72 |
| 6,721,035 B1 | * | 4/2004 | Segers et al. .................. 355/53 |
| 6,747,783 B1 | | 6/2004 | Sandstrom |
| 6,965,426 B2 | * | 11/2005 | Takashima ..................... 355/53 |
| 7,016,020 B2 | * | 3/2006 | Munnig Schmidt .......... 355/72 |
| 7,067,942 B2 | * | 6/2006 | Korenaga et al. ............. 310/12 |
| 7,167,234 B2 | * | 1/2007 | Cox et al. ..................... 355/72 |
| 2006/0072098 A1 | * | 4/2006 | Dams ........................... 355/72 |

FOREIGN PATENT DOCUMENTS

| | | |
|---|---|---|
| WO | WO 98/33096 A1 | 7/1998 |
| WO | WO 98/38597 A2 | 9/1998 |
| WO | WO 98/38597 A3 | 9/1998 |

OTHER PUBLICATIONS

Compter, J.C., "Electro-Dynamic Planar Motor", Precision Engineering, 28(2):171-180, Apr. 2004, 13 pgs.

Dirk-Jan van Lubek, "Demonstrator of a φ-z Motor", M. Sc. Thesis, Jul. 2000, 80 pgs.

* cited by examiner

*Primary Examiner*—Hung Henry Nguyen
(74) *Attorney, Agent, or Firm*—Sterne, Kessler, Goldstein & Fox P.L.L.C.

(57) ABSTRACT

A positioning device for positioning an object table includes a frame for supporting the object table in a first direction and a motor constructed and arranged to exert a first force on the object table in a second direction substantially perpendicular to the first direction and a second force on the object table in a third direction substantially perpendicular to the first direction and the second direction. A first part of the motor is constructed and arranged to co-operate with a second part for generating the first and second force. The first part is arranged on the object table, such that both the first force and the second force are directed substantially through the center of gravity of the object table.

20 Claims, 10 Drawing Sheets

LITHOGRAPHIC APPARATUS AND DEVICE MANUFACTURING METHOD UTILIZING A POSITIONING DEVICE FOR POSITIONING AN OBJECT TABLE

BACKGROUND

1. Field

The present invention relates to a lithographic apparatus and a device manufacturing method. The present invention also relates to devices and methods for programming an array of individually controllable elements configured to modulate a beam of radiation.

2. Related Art

A lithographic apparatus is a machine that applies a desired pattern onto a substrate, usually onto a target portion of the substrate. A lithographic apparatus can be used, for example, in the manufacture of flat panel displays, integrated circuits (ICs), and other devices involving fine structures. In a conventional apparatus, a patterning device, which can be referred to as a mask or a reticle, can be used to generate a circuit pattern corresponding to an individual layer of a flat panel display or other device. This pattern can be transferred onto a target portion (e.g., comprising part of one or several dies) on a substrate (e.g., a glass plate). Transfer of the pattern is typically via imaging onto a layer of radiation-sensitive material (e.g., resist) provided on the substrate.

Many scanners employ a movable chuck (or object table) for supporting the substrate which passes through the patterned beam. In machines of this type, an accurate position control of the substrate with respect to the patterned beam is desired. In general, a positioning device comprising linear electromagnetic actuators or motors are applied to accurately position the movable chuck that supports the substrate. These actuators or motors are supplied from a single phase or a multiphase power supply and controlled by a position controller. In order to accurately position the substrate, a comparatively high bandwidth of the position controlled loop can be required.

In a lithographic apparatus for manufacturing FPD substrates, the chuck for moving the substrate is generally very large (e.g., FPD substrates are typically up to 1-2 m along each side) and heavy. The servo bandwidth can be limited in this respect by the internal dynamics of the chuck in case these dynamics are excited by the forces of the positioning device.

Because a lithographic apparatus is usually applied in a clean room environment, a small footprint of a lithographic apparatus is desired because this allows the customer to apply the available space in the clean environment as effective as possible. Therefore, it is desired to have a compact positioning device in order not to increase the overall size of the apparatus. This applies in particular to a lithographic apparatus for manufacturing FPD substrates because of the large size of the FPD substrates.

In a lithographic apparatus for manufacturing FPD substrates, the substrate can be irradiated by a beam, while synchronously scanning the substrate relative to the beam. The positioning device accurately positions the substrate relative to the beam, at least in a plane perpendicular to the direction of the beam. In general, the required displacement (provided by the positioning device) will be substantial in the scanning direction, while only minor displacements are required in a direction perpendicular to the scanning direction and perpendicular to the direction of the beam because in most cases. The projection system can extend over the entire width of the substrate.

Conventional positioning devices that are used to displace objects or object tables over large distances in one direction (e.g., the scanning direction) and over comparatively small distances in a direction perpendicular to this direction (e.g., positioning devices for displacing a reticle stage) are often not optimized with respect to the dynamic behavior due to the internal dynamics of the chuck.

Therefore, it is an object of the present invention to provide an improved positioning device wherein the effects of the internal dynamics are mitigated.

SUMMARY

In accordance with one embodiment of the present invention, there is provided a positioning device for positioning an object table comprising an object table, a frame, and a motor. The frame supports the object table in a first direction. The motor unit is constructed and arranged for exerting a first force on the object table in a second direction substantially perpendicular to the first direction and a second force on the object table in a third direction substantially perpendicular to the first direction and the second direction. The motor unit comprises a first part constructed and arranged to co-operate with a second part for generating the first and second force. The first part is arranged on the object table, such that both the first force and the second force are directed substantially through the centre of gravity of the object table.

In accordance with one embodiment of the present invention, there is provided a lithographic apparatus comprising an illumination system, a frame, a patterning arrangement, a projection system, and a positioning device. The illumination system supplies a beam of radiation. The frame supports an object table in a first direction. The patterning arrangement imparts the beam with a pattern in its cross-section. The projection system projects the patterned beam onto a target portion of a substrate. The positioning device comprises a motor unit constructed and arranged for exerting a first force on the object table in a second direction substantially perpendicular to the first direction and a second force on the object table in a third direction substantially perpendicular to the first direction and the second direction. The motor unit comprises a first part constructed and arranged to co-operate with a second part for generating the first and second force. The first part is arranged on the object table, such that both the first force and the second force are directed substantially through the centre of gravity of the object table.

In accordance with one embodiment of the present invention, there is provided a device manufacturing method comprising the following steps. Supplying a beam of radiation. Imparting the beam with a pattern using a patterning arrangement. Arranging a substrate on an object table. Supporting the object table by a base frame in a first direction. Projecting the patterned beam onto a target portion of the substrate. Displacing the object table relative to the patterned beam using a positioning device comprising a motor unit constructed and arranged for exerting a first force on the object table in a second direction substantially perpendicular to the first direction and a second force on the object table in a third direction substantially perpendicular to the first direction and the second direction. The motor unit comprises a first part constructed and arranged to co-operate with a second part for generating the first and second force. The first part is arranged on the object table, such that both the first force and the second force are directed substantially through the centre of gravity of the object table.

In one example, the support provided in the first direction can be a bearing system, such as an air bearing, or can be an active support obtained by one or more actuators provided between the frame and the object table. By doing so, the object table can be driven in additional degrees of freedom (e.g., the first direction, or a rotation about the second or third direction).

In one example, the patterning arrangement can comprise an array of individually controllable elements, and the projection system and patterning arrangement can together comprise an array of projection elements.

In one example, a preconditioning system is provided for thermally preconditioning one of the substrates while another substrate is passed through the patterned beam. The preconditioning system can be located in the same place as the loading device so that preconditioning can take place while the substrate is located on the loading device. The preconditioning can also take place after the substrate has been placed onto the chuck.

In one example, a base frame is provided for supporting the projection system, metrology system and the chuck. An unloading device can be provided for removing the substrates from their respective chucks.

Further embodiments, features, and advantages of the present inventions, as well as the structure and operation of the various embodiments of the present invention, are described in detail below with reference to the accompanying drawings.

BRIEF DESCRIPTION OF THE DRAWINGS

The accompanying drawings, which are incorporated herein and form a part of the specification, illustrate one or more embodiments of the present invention and, together with the description, further serve to explain the principles of the one or more embodiments of the present invention and to enable a person skilled in the pertinent art to make and use the one or more embodiments of the present invention.

Figure 1:
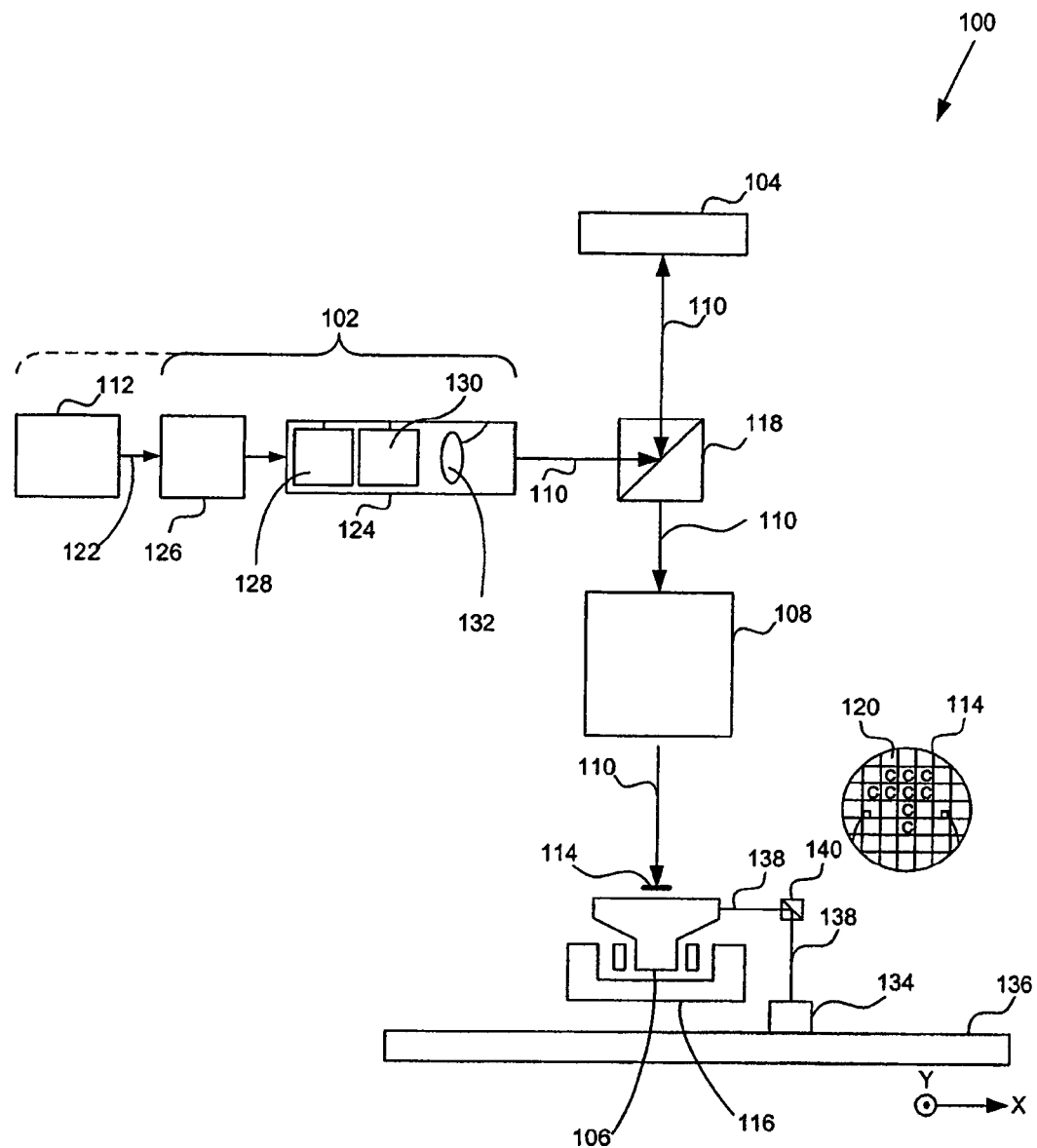
FIG. 1 depicts a lithographic apparatus, according to one embodiment of the invention.

The present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION

Overview and Terminology

Positioning devices can be used to displace objects or object tables over comparatively small distances in a direction perpendicular to this direction (e.g., positioning devices for displacing a reticle stage as described in U.S. Pat. No. 6,449,030) are often not optimized with respect to the dynamic behavior due to the internal dynamics of the chuck The terms "contrast device," "patterning device," "patterning array," or "array of individually controllable elements" used herein should be broadly interpreted as referring to any device that can be used to modulate the cross-section of a radiation beam such as to create a pattern in a target portion of the substrate. It should be noted that the pattern imparted to the radiation beam may not exactly correspond to the desired pattern in the target portion of the substrate, for example if the pattern includes phase-shifting features or so called assist features. Similarly, the pattern eventually generated on the substrate may not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes. Generally, the pattern created on the target portion of the substrate will correspond to a particular functional layer in a device being created in the target portion, such as an integrated circuit. The terms "light valve" and "Spatial Light Modulator" (SLM) can also be used in this context. Examples of such patterning devices include the following.

A programmable mirror array can comprise a matrix-addressable surface having a viscoelastic (e.g., having viscous as well as elastic properties) control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate.

An array of diffractive optical MEMS devices (Micro Electro-Mechanical Systems) can also be used in a corresponding manner. Each diffractive optical MEMS device is comprised of a plurality of reflective ribbons that can be deformed relative to one another to form a grating that reflects incident light as diffracted light.

A further alternative embodiment of a programmable mirror array employs a matrix arrangement of tiny mirrors, each of which can be individually tilted about an axis by applying a suitable localized electric field, or by employing piezoelectric actuation means. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. Mirror arrays are described in, for example, U.S. Pat. Nos. 5,296,891 and 5,523,193, and PCT patent applications WO 98/38597 and WO 98/33096, which are incorporated herein by reference in their entireties.

A programmable LCD array is another example patterning device, and programmable LCD arrays are described in, for example, U.S. Pat. No. 5,229,872, which is incorporated herein by reference in its entirety.

The lithographic apparatus can comprise one or more patterning arrays. For example, it can have a plurality of arrays of individually controllable elements, each controlled independently of each other. In such an arrangement, some or all of the arrays of individually controllable elements can have at least one of a common illumination system (or part of an illumination system), a common support structure for the arrays of individually controllable elements and a common projection system (or part of the projection system).

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. Any use of the term "projection lens" herein can be considered as synonymous with the more general term "projection system".

The projection system can image the pattern on the array of individually controllable elements, such that the pattern is coherently formed on the substrate. Alternatively, the projection system can image secondary sources for which the elements of the array of individually controllable elements act as shutters. In this respect, the projection system can comprise an array of focusing elements, such as a micro lens array (known as an MLA) or a Fresnel lens array, e.g., to form the secondary sources and to image spots onto the substrate. In such an arrangement, each of the focusing elements in the array of focusing elements can be associated with one of the individually controllable elements in the array of individually controllable elements. Alternatively, the projection system can be configured such that radiation from a plurality of the individually controllable elements in the array of individually controllable elements is directed to one of the focusing elements in the array of focusing elements and from there onto the substrate.

As herein depicted in the figures below, the apparatus is of a reflective type (e.g., employing a reflective array of individually controllable elements). Alternatively, the apparatus can be of a transmissive type (e.g., employing a transmissive array of individually controllable elements).

The lithographic apparatus can be of a type having two (e.g., dual stage) or more (e.g., multiple stage) substrate tables. In such "multiple stage" machines the additional tables can be used in parallel, or preparatory steps can be carried out on one or more tables while one or more other tables are being used for exposure.

The lithographic apparatus can also be of a type wherein at least a portion of the substrate can be covered by an "immersion liquid" having a relatively high refractive index, e.g., water, so as to fill a space between the projection system and the substrate. An immersion liquid can also be applied to other spaces in the lithographic apparatus, for example, between the contrast device and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

It should be appreciated that where pre-biasing of features, optical proximity correction features, phase variation techniques and multiple exposure techniques are used, for example, the pattern "displayed" on the array of individually controllable elements may differ substantially from the pattern eventually transferred to a layer of or on the substrate. Similarly, the pattern eventually generated on the substrate may not correspond to the pattern formed at any one instant on the array of individually controllable elements. This may be the case in an arrangement in which the eventual pattern formed on each part of the substrate is built up over a given period of time or a given number of exposures during which the pattern on the array of individually controllable elements and/or the relative position of the substrate changes.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat panel displays, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

In another example, the invention can take the form of a computer program containing one or more sequences of machine-readable instructions describing a method as disclosed above, or a data storage medium (e.g. semiconductor memory, magnetic or optical disk) having such a computer program stored therein.

Exemplary Environment

FIG. 1 schematically depicts a lithographic projection apparatus 100 according to an embodiment of the invention. Apparatus 100 includes at least a radiation system 102, an array of individually controllable elements 104 (e.g., a contrast device or patterning device), an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., a frequency tripled Nd:YAG laser in pixel grid imaging mode or an excimer laser in other modes) can produce a beam of radiation 122. Beam 122 is fed into an illumination system (e.g., illuminator) 124, either directly or after having traversed conditioning device 126, such as a beam expander, for example.

In one example, when apparatus 100 is operating in a pixel grid imaging mode, illuminator 124 can comprise an adjusting device 128 for setting a zoom to adjust a spot size of beam 122. In addition, illuminator 124 will generally include various other components, such as spot generator 130 and a condenser 132. For example, spot generator 130 can be, but is not limited to, a refractive or diffractive grating, segmented mirrors arrays, waveguides, or the like. In this way, beam 110 impinging on the array of individually controllable elements 104 has a desired zoom, spot size, uniformity, and intensity distribution in its cross section.

In another example, when apparatus 100 is operating in other modes, illumination 124 can comprise an adjusting device 128 for setting the outer and/or inner radial extent (commonly referred to as (σ-outer and σ-inner, respectively) of the intensity distribution in beam 122. In addition, illuminator 124 will generally include various other components, for example beam conditioner 126 (e.g., a beam expander). In this example, element 130 could be an integrator 130 and element 132 could be a condenser 132, compared to the example discussed above. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100. In alternative embodiments, source 112 can be remote from lithographic projection apparatus 100. In this case, radiation beam 122 would be directed into apparatus 100 (e.g., with the aid of suitable directing mirrors). It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 10 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved, so as to position different target portions 120 in the path of beam 110. Where used, the positioning device (not shown) for the array of individually controllable elements 104 can be used to correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in a plurality of modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: similar to step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: similar to pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially the same shape. On substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2A:
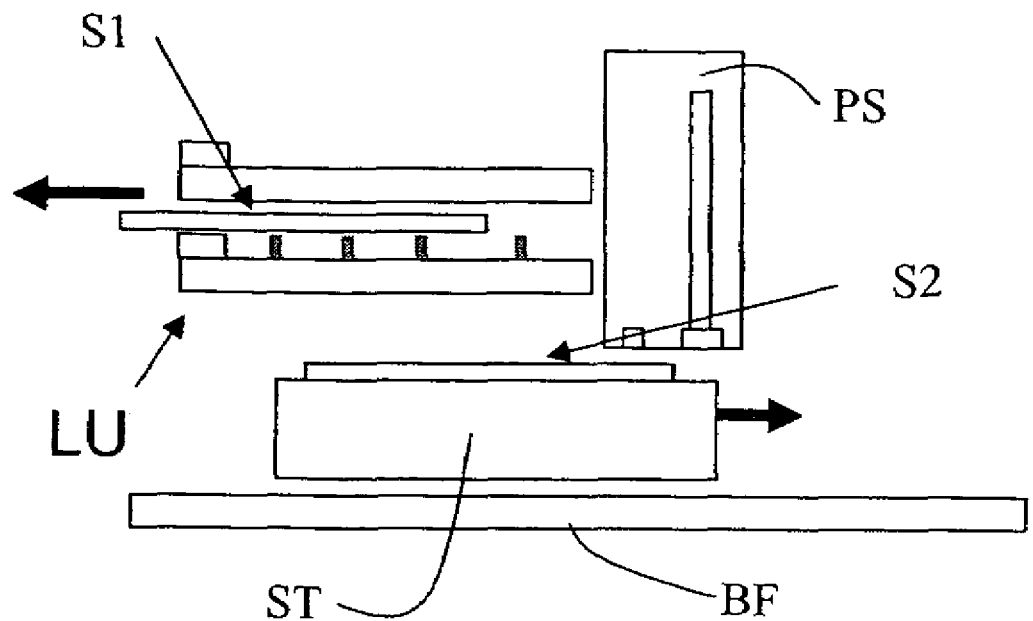
FIGS. 2a and 2b schematically show first and second side views of a lithographic apparatus, according to one embodiment of the present invention.
Figure 2B:
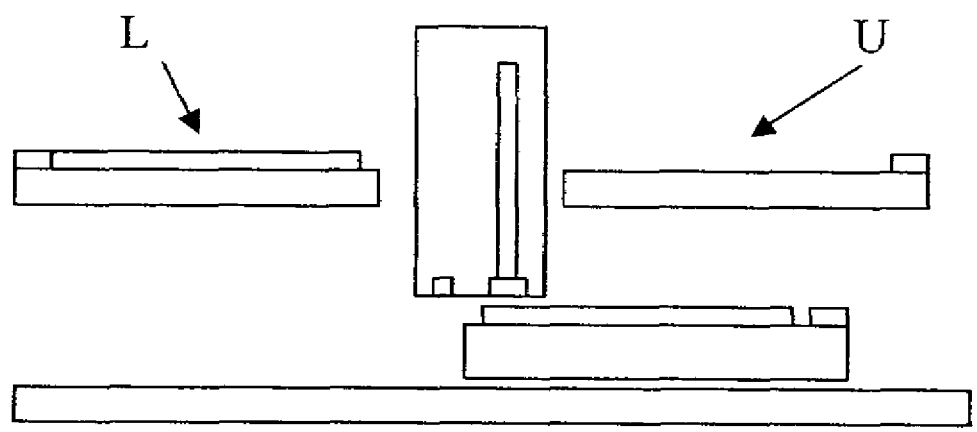

FIGS. 2a and 2b schematically shows first and second side views of a lithographic apparatus, according to one embodiment of the present invention. The apparatus comprises a base frame BF supporting a substrate table ST for supporting a substrate. The apparatus further comprises a projection system PS for projecting a patterned beam onto the substrate S2. The apparatus is further equipped with a load/unload unit LU for transporting a substrate S1 to and from the substrate table.

As shown in FIG. 2b, the loading L and unloading U can also take place on opposite sides of the apparatus.

In one example, the projection system can be mounted on a metrology frame (not shown) that is mounted on the base frame via three or more vibration isolators.

In one example, the apparatus can further comprise a preconditioning system (not shown), for example thermal preconditioning of the substrates and/or for cleaning the substrates. The preconditioning unit can be located in the same region as the load/unload unit. Various embodiments of the positioning device of the present invention and motors units suitable for use in such positioning devices are described in more detail in the following figures.

Figure 3:
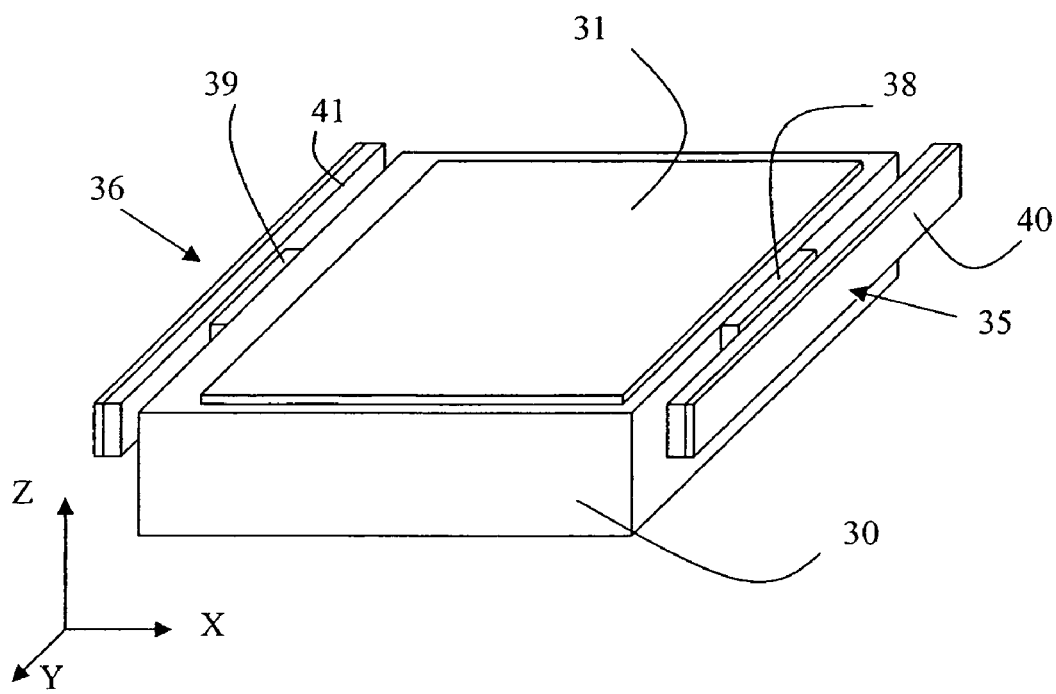
FIG. 3 schematically depicts a movable chuck arrangement including two motor units, according to one embodiment of the present invention.

FIG. 3 schematically shows a plan view of a first embodiment of a positioning device, according to one embodiment of the present invention. The positioning device comprises a movable chuck (or object table) 30 provided with a substrate 31. The chuck or object table 30 can be displaced by means of two motors 35, 36 positioned on opposite sides of the chuck 30, such that the resulting forces exerted by the motors 35, 36 are substantially directed through the center of gravity of the movable chuck 30. Generally, each of the motors 35, 36 is constructed and arranged to generate forces in both the Y-direction and in the X-direction. Each of the motors 35, 36 comprises a first part 38, 39 constructed and arranged to co-operate with a second part 40, 41 for generating the forces. In various examples, the second part 40, 41 can be arranged on a frame (not shown) that supports the object table or on a second frame. In the latter case, the frame and the second frame can be isolated from each other by, e.g., vibration isolators, such air mounts or springs. Alternatively, the second part 40,41 can be arranged as a balance mass displaceable in the second and third direction due to the reaction forces exerted by the motors.

By arranging the motor forces in line with the center of gravity, as depicted in FIG. 3, an improved dynamic behavior of the object table is obtained, because the parasitic Rx,Ry-torques, that excite internal stage dynamics are eliminated or mitigated. Note that the improved dynamic behavior can also be obtained when only one of the motors 35, 36 is constructed and arranged to generate a force in the X-direction, provided that the force is directed substantially through the center of gravity.

In one example, the movable stage will be supported and/or guided by means of bearings, such as air bearings. Such an arrangement results in a mechanical resonance determined by the internal out-of-plane stiffness of the chuck and the stiffness of the bearings, in particular the bearing stiffness with respect to the Z-direction, the rotation about the X-axis and the rotation about the Y-axis. Excitation of these resonances can limit the bandwidth of a controller controlling the chuck position. As a consequence, the servo accuracy (and therefore the position accuracy) of the chuck can be affected. By the arrangement as depicted in FIG. 3, the mechanical resonances are virtually not excited, resulting in an improved dynamic behavior.

In one example, the positioning device as described in FIG. 3 can be considered to be actuated in 3 degrees of freedom. In one example, the object table is supported in the first direction by actuators. In one example, when three or more actuators are provided, the object table can be actuated in 6 degrees of freedom (6 DoF). Such a 6 DoF actuated object table provides an improved dynamic behavior since it can also compensate for disturbances in the first direction.

Figure 4:
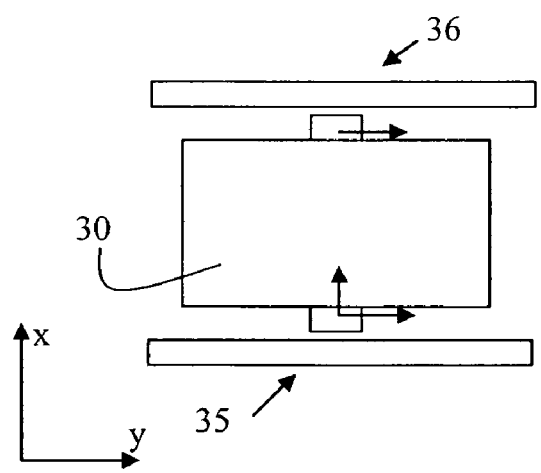
FIG. 4 schematically shows an XY-view of the arrangement of FIG. 11, according to one embodiment of the present invention.

FIG. 4 schematically shows an XY-view of the arrangement of FIG. 11, according to one embodiment of the present invention. Because at least one of the motors as describes can provide both a force in the scanning direction (Y-direction) and in the non-scanning direction (X-direction), (motor 35 as schematically depicted in FIG. 4) the positioning device as described can advantageously be applied to reduce the impact on the footprint of the lithographic apparatus.

Figure 5:
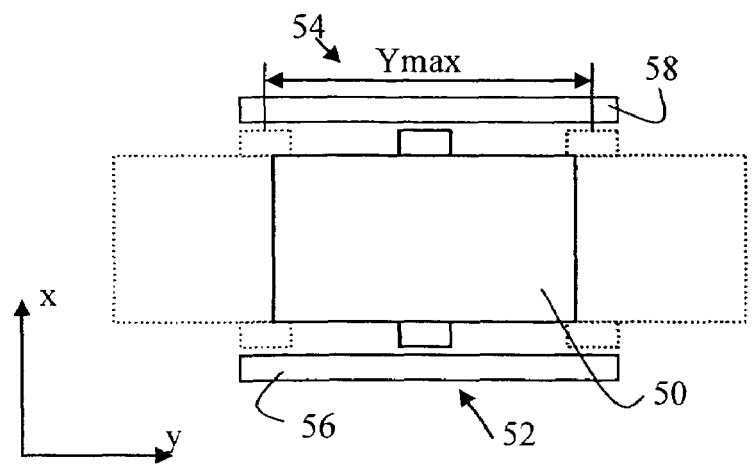
FIG. 5 schematically shows the possible stroke in the Y-direction for the arrangement of FIG. 12, according to one embodiment of the present invention.

FIG. 5 schematically shows the possible stroke in the Y-direction for the arrangement of FIG. 12, according to one embodiment of the present invention. FIG. 5 illustrates a length of the magnet assembly resulting in a predefined stroke of the movable chuck in the Y-direction. The figure schematically depicts a movable chuck 50 and two motors 52, 54, each arranged on one side of the chuck. In order to displace the chuck over a stroke in the Y-direction (e.g., the scanning direction) a corresponding length of the parts 56, 58 of the motors is required. The dotted lines in FIG. 5 indicate the ultimate positions of the chuck in the Y-direction determining the available stroke Ymax for the movable chuck relative to the parts 56, 58.

Figure 6:
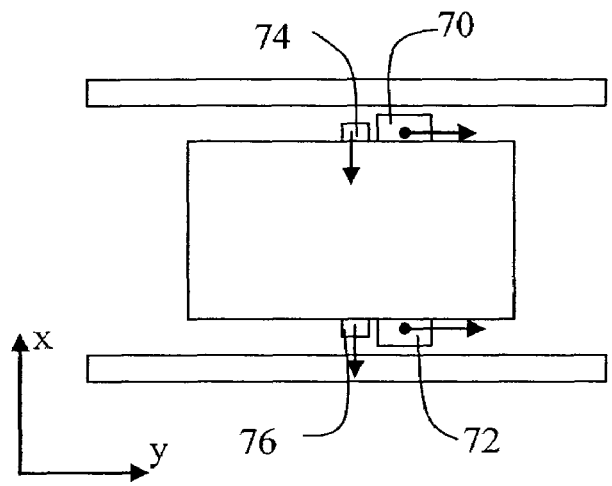
FIG. 6 schematically shows an XY-view of an arrangement with separate X- and Y-motors, according to one embodiment of the present invention FIG. 7 schematically depicts an XZ-view of a motor suitable for use in a positioning device, according to one embodiment of the present invention.

FIG. 6 schematically shows an XY-view of an arrangement with separate X- and Y-motors, according to one embodiment of the present invention. FIG. 6 illustrates how such an arrangement could be realized using linear motors 70, 72 (e.g., linear motors comprising a magnet assembly and a coil unit) for generating a force in the Y-direction and two linear motors or actuators 74, 76 for generating a force in the X-direction. In the arrangement as shown, the linear motor 70 and the actuator 74 can apply a common magnet assembly, or each motor can have its own magnet assembly. In either case, it will be clear that in order to ensure the same stroke in the Y-direction as in FIG. 5, the overall length of the magnet assembly (or assemblies) should be enlarged in the Y-direction (due to the fact that the X-motor and the Y-motor are arranged adjacent to each other in the Y-direction).

The following figures describe various motors suitable for use in the positioning device of the present invention.

Figure 7:
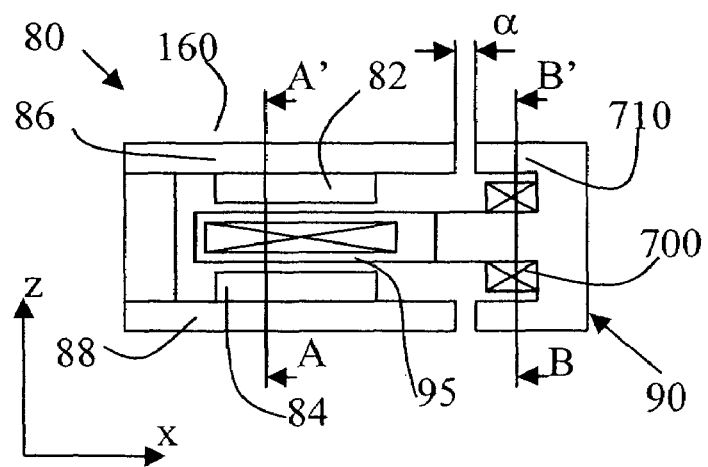

FIG. 7 schematically depicts an XZ-view of a motor suitable for use in a positioning device, according to one embodiment of the present invention. The motor comprises a magnet assembly 80 comprising two arrays of permanent magnets 82, 84, each arranged on a ferromagnetic member or back iron 86, 88, and a coil assembly 90. The coil assembly comprises a coil unit comprising a plurality of coils 95 arranged in between the arrays of permanent magnets and a coil 700 arranged on a ferromagnetic yoke 710.

Figure 8:
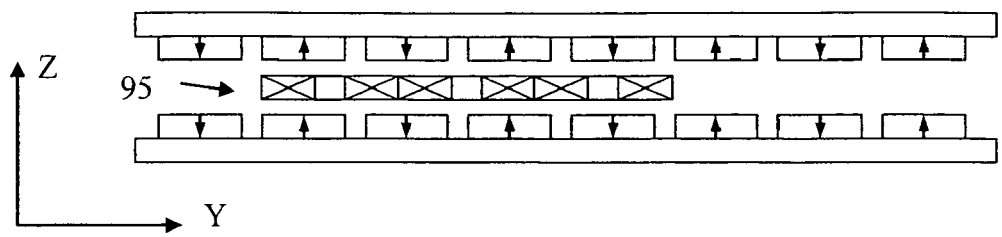
FIG. 8 schematically depicts a first XY-view of the motor of FIG. 7, according to one embodiment of the present invention.
Figure 9:
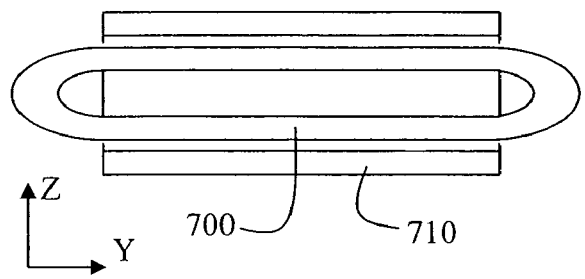
FIG. 9 schematically depicts a second XY-view of the motor of FIG. 7, according to one embodiment of the present invention.

FIG. 8 schematically depicts a first XY-view of the motor of FIG. 7, according to one embodiment of the present invention. FIG. 9 schematically depicts a second XY-view of the motor of FIG. 7, according to one embodiment of the present invention. FIG. 8 schematically shows a cross-sectional view of the motor along the line A-A' as indicated in FIG. 7, and FIG. 9 schematically shows a cross-sectional view of the motor along the line B-B' as indicated in FIG. 6.

In one example, when the plurality of coils 95 is powered by a multi-phase power supply, a force can be generated that is directed substantially along the Y-direction. By powering the coil 700 arranged on the ferromagnetic yoke 710, an attractive force (reluctance force) is generated between the ferromagnetic yoke and the back irons of the permanent magnet arrays (items 86 and 88 in FIG. 7). This arrangement can be described as a long stroke actuator, comprising of the permanent magnet arrays and the coil unit integrated with a reluctance actuator, comprising the coil 700 arranged on the ferromagnetic yoke 710 and the back irons of the permanent magnet arrays. The motor as described in FIGS. 7 to 9 is particularly suitable for displacing an object (or object table) over comparatively large distances in one direction and comparatively small distances in a direction perpendicular to that direction.

These requirements are found in, e.g., the displacement requirement for a reticle stage in a lithographic apparatus or a substrate stage in a lithographic apparatus for the manufacturing of flat panel displays (FPD) or liquid crystal displays (LCD). The motor as depicted can therefore be suitably applied in a positioning device as depicted in FIG. 3 or 4. In such an arrangement, the first parts 38, 39 can correspond to coil assemblies such as assembly 90 indicated in FIG. 7 and the second parts 40, 41 (of FIG. 3) can correspond to magnet assemblies such as the magnet assembly 80 shown in FIG. 7.

In one example, it can be sufficient to apply the motor as described on one side of the movable chuck and a linear motor on the other side. By doing so, the arrangement becomes less expensive, while substantially maintaining the results as stated (an improved dynamic behavior when the resulting forces in the Y-direction and the X-direction are directed substantially through the centre of gravity and a favorable machine footprint). In another example, the motor can be applied in a moving coil arrangement or in a moving magnet arrangement. In the latter arrangement, the coil arrangement should extend substantially over the entire operating range in the Y-direction, while the magnet assembly is arranged on the movable chuck, such that the force exerted by the magnet assembly on the chuck is substantially directed through the center of gravity.

In one example, the force generated by the reluctance actuator can be expressed in terms of the current I supplied to the coil 700 and the distance α between the ferromagnetic yoke 710 and the back irons 86, 88 (see FIG. 7), and can be approximated by the following equation:

$$F_X = K \frac{I^2}{\alpha^2} \qquad (1)$$

As can be seen, the force generated by the reluctance actuator depends on the distance α between the items 80 and 90. In order to mitigate this non-linear behavior, it is desirable to apply two reluctance motors exerting a force in opposite directions and to provide both actuators with a DC pre-load current in order to generate a pre-load force in both actuators. By doing so, a more linear behavior of the resulting force in the X-direction is obtained, thereby simplifying the implementation of the actuator control.

It should be noted that exemplary electromagnetic motors (or motor units) suitable for displacing an object of comparatively large distances in one direction and comparatively small distances in a direction perpendicular to that direction are taught in U.S. Pat. No. 6,252,314, which is incorporated by reference herein in its entirety. The particular combination of a linear motor and a reluctance actuator as described is desired in that it can provide a more compact and less expensive solution. Using a Lorentz actuator instead of the proposed reluctance actuator requires an additional magnet assembly that adds to the volume of the motor and that is rather expensive. Because the reluctance actuator described in FIGS. 7 to 9 exerts a force directly to the back irons of the linear motor a compact and rather inexpensive solution is obtained.

In order to describe some further embodiments of motors suitable for use in the positioning device of the present invention, some basic electromagnetic principles related to linear motors will be explained first.

Figure 10:
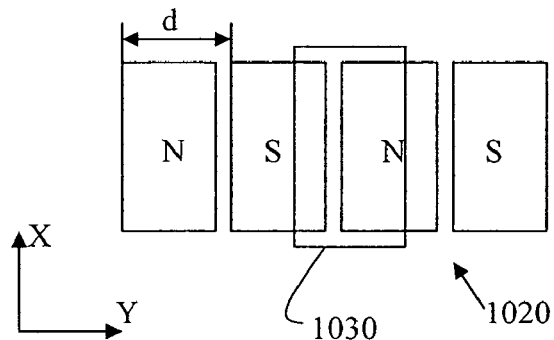
FIG. 10 schematically depicts an array of permanent magnets and a coil, according to one embodiment of the present invention.

FIG. 10 schematically depicts an array of permanent magnets and a coil, according to one embodiment of the present invention. FIG. 10 schematically depicts an XY view of an array of permanent magnets 1020 and a current carrying coil (depicted by the rectangle 1030). It is further assumed that the magnetic field is directed substantially in the Z-direction (perpendicular to both the X-direction and the Y-direction) and varies substantially sinusoidal along the Y-direction. It is further assumed that the magnetic field does not extend beyond the magnets in the X-direction. Based on these assumptions, the force exerted on a coil can easily be determined. Alternatively, the force can be determined by considering the flux linkage of the coil and determining the variation of said coil for a displacement in either the X-direction or the Y-direction.

FIGS. 11a-11f schematically depict the forces exerted on a coil for various positions of the coil with respect to an array of permanent magnets, according to one embodiment of the present invention. FIGS. 11a-11f schematically depict various positions of a coil 1130 relative to the permanent magnet array 1120, and the forces generated. The bold line pieces in FIGS. 11a-11f indicate the different part of the coil on which a force is exerted for the given coil position, the arrows indicate the direction of the force. They are not to be considered an indication of the amplitude of the force. The actual amplitude of the force generated by a specific line piece can be determined based on the actual length of the line piece, the value of the current (i) and the magnetic field distribution.

Figure 11A:
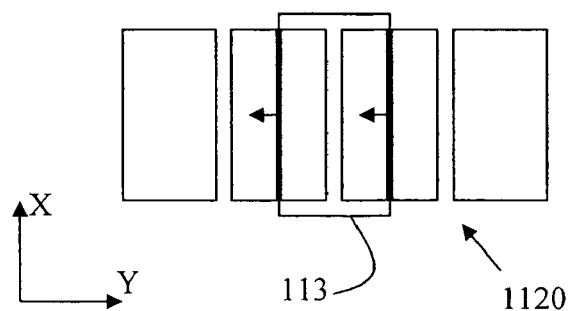
FIGS. 11a-11f schematically depict the forces exerted on a coil for various positions of the coil with respect to an array of permanent magnets, according to one embodiment of the present invention.
Figure 11B:
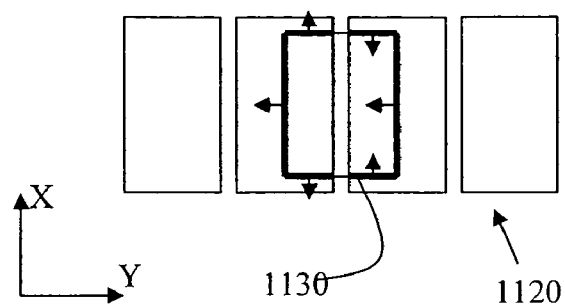
Figure 11C:
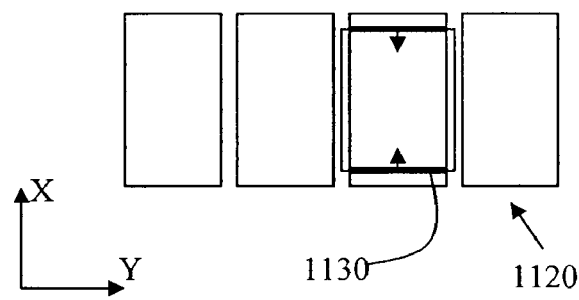

The basic law that is applicable is that the force exerted or generated is proportional to the current (i) and to the magnetic field density (B) and is directed perpendicular to the direction of the current and perpendicular to the magnetic field. FIGS. 11a-11c schematically depict the generated force by a coil 1130 when it is positioned symmetrically with respect to the magnet array 1120. As can be seen, a symmetrical position of the coil can result in a force generated in the Y-direction, while the resulting force in the X-direction is substantially zero. The forces generated on the end-turns of the coil (corresponding to the line pieces of the coil 1130 extending in the Y-direction) compensate each other in the coil positions as depicted. In case the coil is shifted relative to the magnet array in the X-direction in such manner that one end-turn is linked to the magnetic field (FIGS. 11d-11f), one may notice that also in the X-direction a resulting force can be generated.

Figure 11D:
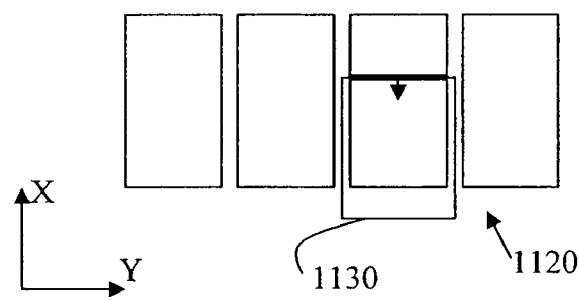
Figure 11E:
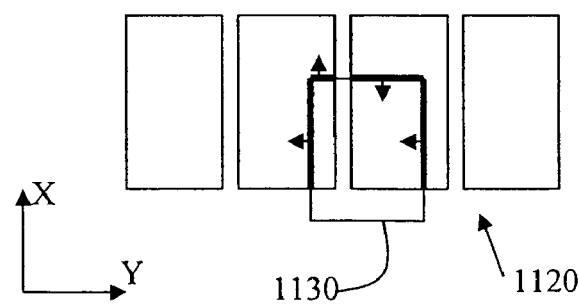
Figure 11F:
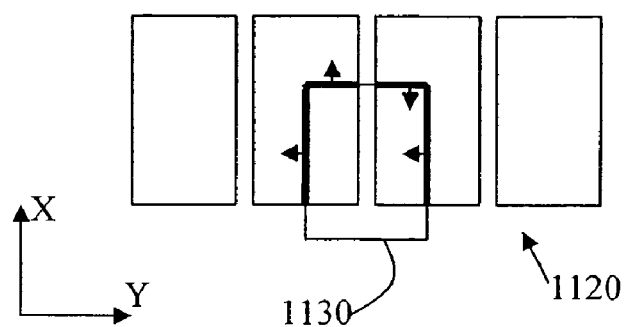

Comparing FIG. 11d (having only a resulting force in the X-direction) with FIG. 11f (having only a resulting force in the Y-direction), one can conclude that Fx at its maximum when Fy equal to zero and vice-versa. Based on the assumption that the magnetic field variation is sinusoidally with respect to the Y-direction, the following expressions can be derived for the forces exerted on a current carrying coil (carrying a current i) as a function of the Y-position of the coil.

$$F_x = Kmx * \sin\left(\frac{\pi y}{d}\right) * i$$
$$F_y = Kmy * \cos\left(\frac{\pi y}{d}\right) * i$$
(2)(a) and 2(b)

Parameters Kmx and Kmy are constants depending a.o. on the magnetic field strength and the geometric parameters of the coil, d is the magnetic pitch as indicated in FIG. 10. Note that Kmx=0 in case the coil is symmetrically arranged in the X-direction.

Figure 12A:
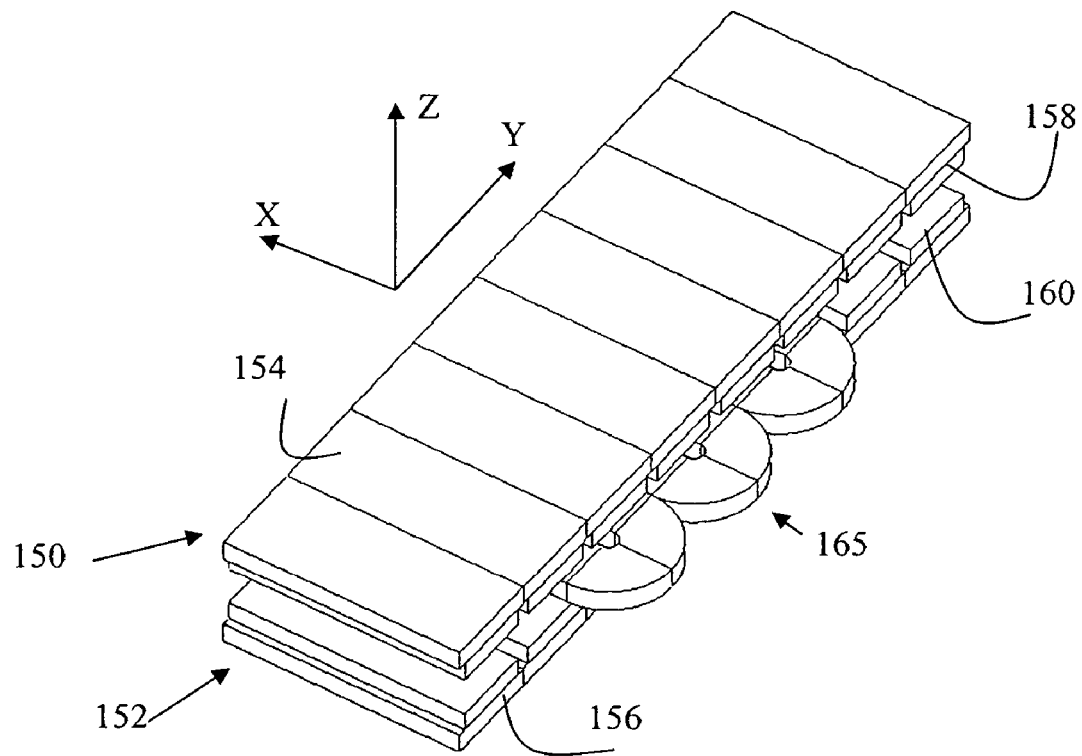
FIGS. 12a and 12b schematically depict a second motor suitable for use in a positioning device, according to one embodiment of the present invention.

The principle explained in FIGS. 11a to 11f can be applied in a motor suitable for use in The positioning device of the present invention. FIG. 12a schematically depicts such a motor.

Figure 12B:
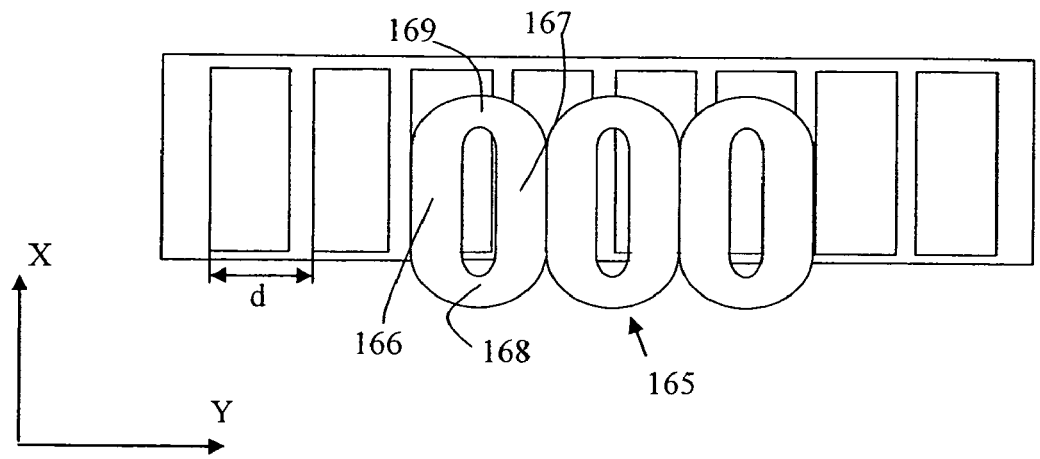

FIGS. 12a and 12b schematically depict a second motor suitable for use in a positioning device, according to one embodiment of the present invention. FIG. 12a schematically depicts a motor comprising two magnet assemblies 150, 152, each comprising a ferromagnetic yoke 154, 156 and an array of permanent magnets 158, 160 arranged on said yoke. The motor further comprises a coil assembly 165 comprising three coils arranged adjacent to each other in the Y-direction.

Each coil comprises two coil sides 166, 167 and two end turn parts 168, 169 connecting the coil sides. The coil assembly is arranged relative to the magnet assemblies in such manner that one end-turn part of the coils is arranged in the magnetic field of the magnet assemblies.

This can also be seen in FIG. 12b, which shows an XY-view of the motor of FIG. 2a without the upper magnet assembly. In the arrangement shown, the length of the coil unit (in the Y-direction) equals 4 times the magnetic pitch d. In one example, the coil unit can suitably be powered by a three-phase power supply in order to generate a force between the coil unit and the magnet assembly. In one example, the coil unit can also comprise multiple sets of three coils. These sets can be arranged in series or in parallel. Alternatively, a two-phase coil unit can also be applied to generate a force between the coil unit and the magnet assembly. In one example, a multi-phase coil unit and a multi-phase power supply can be applied. Such a multi-phase power supply can encompass, e.g., three-phase current supply, a plurality of single phase power supplies.

In case the coils are supplied from a three-phase current source, the currents supplied to the coils can, in general, be expressed as:

$$i_1 = i * \sin(2\pi f \cdot t + \varphi)$$
$$i_2 = i * \sin\left(2\pi f \cdot t + \varphi + \frac{2\pi}{3}\right)$$
$$i_3 = i * \sin\left(2\pi f \cdot t + \varphi + \frac{4\pi}{3}\right)$$
(3)(a)-(c)

Wherein f represents the frequency of the currents, t denotes the time and φ denotes the commutation angle.

In case the three coils of the coil unit are arranged to span 4 times the magnetic pitch d (as done in FIG. 12b), the forces exerted on the different coils can be expressed as (using equation (2)(a) and (b) to express the position dependency of the force in the different coils):

$$F_1 = \left[Kmx * \sin\left(\frac{\pi y}{d}\right) + Kmy * \cos\left(\frac{\pi y}{d}\right)\right] * i * \sin(2\pi f \cdot t + \varphi)$$
$$F_2 = \left[Kmx * \sin\left(\frac{\pi y}{d} + \frac{2\pi}{3}\right) + Kmy * \cos\left(\frac{\pi y}{d} + \frac{2\pi}{3}\right)\right] *$$
$$i * \sin\left(2\pi f \cdot t + \varphi + \frac{2\pi}{3}\right)$$
$$F_3 = \left[Kmx * \sin\left(\frac{\pi y}{d} + \frac{4\pi}{3}\right) + Kmy * \cos\left(\frac{\pi y}{d} + \frac{4\pi}{3}\right)\right] *$$
$$i * \sin\left(2\pi f \cdot t + \varphi + \frac{4\pi}{3}\right)$$
(4)(a)-(c)

When the variation of the currents in time is synchronized with the displacement of the coil set in the Y-direction $$\left(\text{by setting} 2\pi f \cdot t = \frac{\pi y}{d}\right),$$

and when the equations are regrouped to present the force generated in the X-direction and in the Y-direction, equation (4) (a)-(c) becomes:

$$Fx = \frac{3}{2} * Kmx * i * \cos(\varphi) \quad \text{(5)(a) and (b)}$$

$$Fy = \frac{3}{2} * Kmy * i * \sin(\varphi)$$

Alternatively, the input current (amplitude i) and commutation angle φ can be expressed as a function of the required Fx and Fy (equations 6(a) and (b)).

$$i = \frac{\sqrt{\left(\left(\frac{Fx}{Kmx}\right)^2 + \left(\frac{Fy}{Kmy}\right)^2\right)}}{3/2} \quad \text{(6)(a) and (b)}$$

$$\varphi = \arctan\left(\frac{Fy/Kmy}{Fx/Kmx}\right)$$

As can be seen from equations (6)(a) and (b), in order to control the required forces in both the X-direction and the Y-direction, both the amplitude i of the current and the commutation angle (p need to be controlled.

Figure 13:
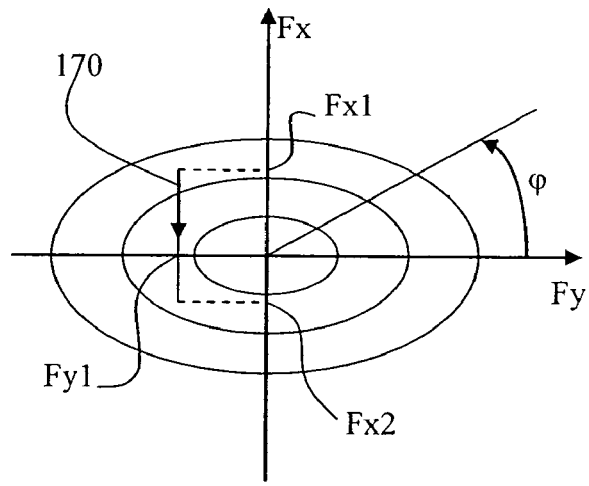
FIG. 13 schematically depicts a diagram representing the force generated by the motor of FIGS. 12a and 12b, according to one embodiment of the present invention.

FIG. 13 schematically depicts a diagram representing the force generated by the motor of FIGS. 12a and 12b, according to one embodiment of the present invention. FIG. 13 schematically shows an Fx/Fy diagram. FIG. 13 schematically depicts the generated forces Fx and Fy as a function of the commutation angle φ and the current amplitude i. Each ellipse in FIG. 13 corresponds to a specific value of the current amplitude i. Given the amplitude of the current and the commutation angle φ, the corresponding forces can easily be found. In case either the force Fx or the force Fy is changed while maintaining the other component constant, the trajectory for changing the commutation angle φ and the current amplitude i can be derived from the FIG. 13. As an example, line 170 describes the trajectory to be followed in order to change the force Fx from Fx1 to Fx2 while maintaining Fy=Fy1.

In one example, the motor as depicted can suitably be applied in a positioning device, as depicted in FIG. 3 or 4. In such an arrangement, the first parts 38, 39 (as shown in FIG. 3) can correspond to coil assemblies, such as the assembly 165 indicated in FIG. 12a and the second parts 40, 41 (of FIG. 3) can correspond to magnet assemblies such as the magnet assemblies 150, 152 shown in FIG. 12a. Also in this arrangement, it can be sufficient to apply the motor as described on one side of the movable chuck and a linear motor on the other side.

Figure 16:
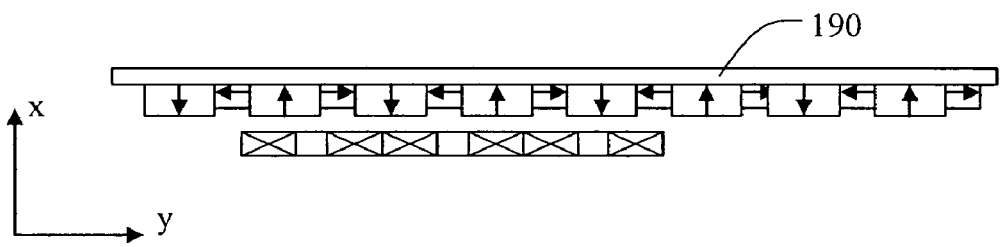
FIG. 16 illustrates the use of a Halbach configuration in the magnet assembly of the motor of FIG. 14, according to one embodiment of the present invention.

In one example, the permanent magnet arrays can comprise a Halbach configuration (an example of such a configuration is shown in FIG. 16). This magnet configuration can result in an increased magnetic field strength on one side of the array, while decreasing the field strength on the other side. As a result, the thickness of the ferromagnetic yoke can be decreased and the efficiency of the motor can be improved by approximately 15-30%.

The FIGS. 14-20b show one or more motors that can be applied in The positioning device of one or more embodiments the present invention.

Figure 14:
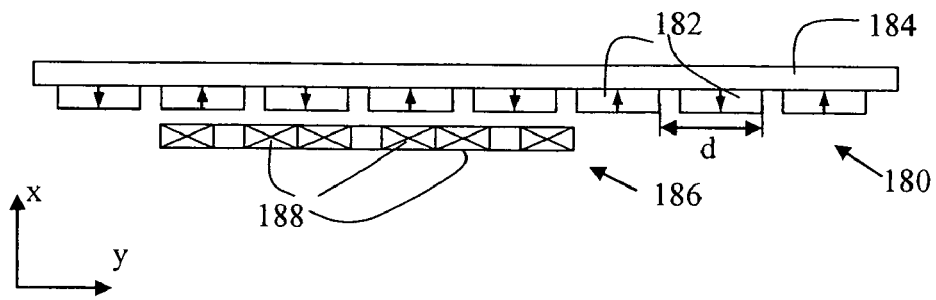
FIG. 14 schematically shows an XY view of a third motor suitable for use in a positioning device, according to one embodiment of the present invention.

FIG. 14 schematically shows an XY view of a third motor suitable for use in a positioning device, according to one embodiment of the present invention. The motor comprises a single-sided magnet assembly 180 comprising an array of permanent magnets 182 arranged on a ferromagnetic yoke 184. The linear motor further comprises a coil unit 186 comprising three adjacent coils 188. In the arrangement shown, the length of the coil unit (in the Y-direction) equals 4 times the magnetic pitch d. In one example, the coil unit is suitable to be powered by a three-phase power supply in order to generate a force between the coil unit and the magnet assembly. In another example, the coil unit can also comprise multiple sets of three coils. These sets can be arranged in series or in parallel. Alternatively, a two-phase coil unit can also be applied to generate a force between the coil unit and the magnet assembly. In general, a multi-phase coil unit and a multi-phase power supply can be applied. Such a multi-phase power supply can encompass, e.g., three-phase current supply, a plurality of single phase power supplies.

Depending on the commutation angle applied, the generated force can be directed in any direction in the XY-plane.

Figure 15:
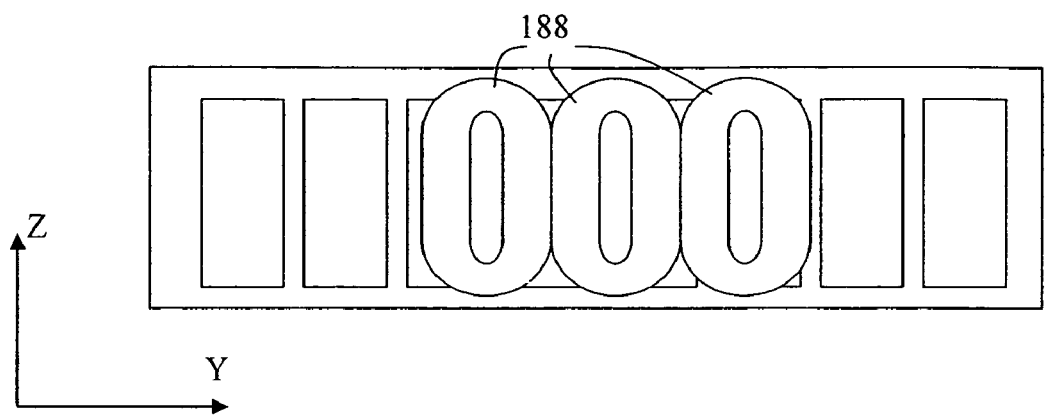
FIG. 15 schematically shows an YZ-view of the motor depicted in FIG. 14, according to one embodiment of the present invention.

FIG. 15 schematically shows an YZ-view of the motor depicted in FIG. 14, according to one embodiment of the present invention. Both the coils 188 of the coil unit and the permanent magnets of the single sided magnet assembly 180 are positioned adjacent to each other in the Y-direction and extend in the Z-direction. Although one may notice some similarities with FIG. 12b, it should be clear that the motor construction is substantially different. Note, e.g., the different orientation of the magnet assembly and the coil assembly, the relative positioning of the coil unit and the magnet assembly, and the single sided magnet assembly compared to the magnet assembly on both sides of the coil unit.

FIG. 16 illustrates the use of a Halbach configuration in the magnet assembly of the motor of FIG. 14, according to one embodiment of the present invention. This magnet configuration results in an increased magnetic field strength on one side of the array, while decreasing the field strength on the other side. The Halbach configuration, as depicted in FIG. 16, results in an increased magnetic field strength on the coil unit side and a decreased magnetic field strength on the magnetic yoke side. As a result, the thickness of the ferromagnetic yoke 190 can be decreased and the efficiency of the motor can be improved by approximately 15-30%.

Figure 17:
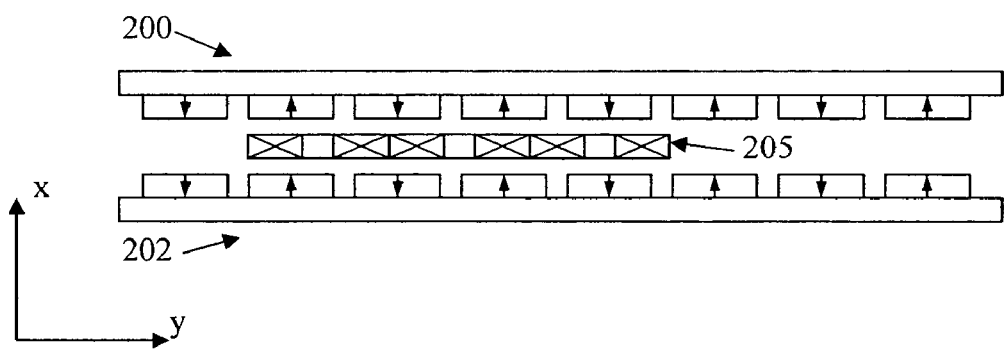
FIG. 17 schematically shows an XY view of a linear motor.

It should be noted that the operation of the motor as depicted in FIGS. 4, 5 and 6 is distinct from the operation of a convention linear motor as depicted in FIG. 17.

FIG. 17 schematically shows an XY view of a linear motor. The linear motor depicted in FIG. 17 comprises two permanent magnet arrays 200, 202 enclosing a coil unit 205 comprising of three adjacent coils. It is further assumed that the coil unit is inserted between the magnet arrays symmetrically such that no resulting force is generated in the Z-direction (perpendicular to both the X-direction and the Y-direction). Furthermore, due to the use of two co-operating permanent magnet arrays, the magnetic field will be directed substantially parallel to the X-direction. As a consequence, a linear motor will generate a force that is substantially directed in the Y-direction, the force magnitude being a function of the current and the commutation angle.

Figure 18:
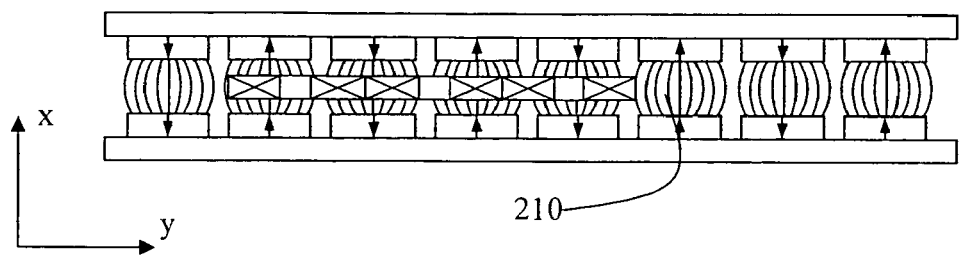
FIG. 18 schematically depicts the magnetic field distribution of the linear motor as shown in FIG. 17.

FIG. 18 schematically depicts the magnetic field distribution of the linear motor as shown in FIG. 17, according to one embodiment of the present invention. The magnetic field is schematically depicted by field lines 210.

Figure 19:
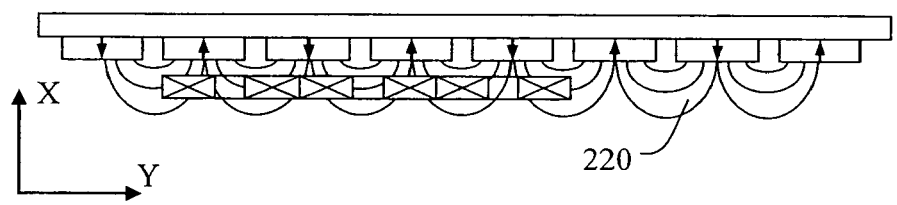
FIG. 19 schematically depicts the magnetic field distribution of the linear motor as shown in FIG. 14, according to one embodiment of the present invention.
Figure 20A:
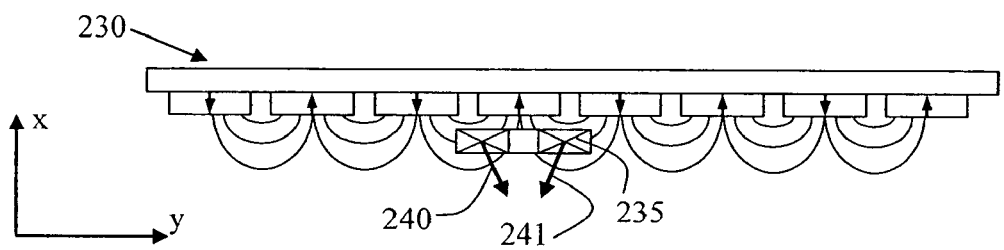
FIGS. 20a and 20b schematically depict the forces generated by a current carrying coil for different positions in the magnetic field distribution, according to one embodiment of the present invention.
Figure 20B:
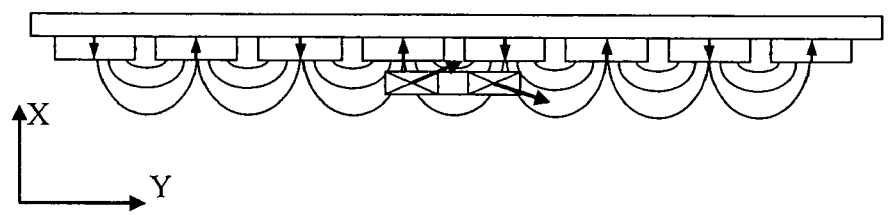

FIG. 19 schematically depicts the magnetic field distribution of the linear motor as shown in FIG. 14, according to one embodiment of the present invention. FIGS. 20a and 20b schematically depict the forces generated by a current carrying coil for different positions in the magnetic field distribution, according to one embodiment of the present invention. As can be seen in FIG. 19, the orientation of the field lines 220 is strongly position dependent. As a consequence, the direction of the force generated by a current carrying coil will vary accordingly. This is illustrated in FIGS. 20a and 20b. These figures schematically depict a magnet assembly 230 and a coil 235. Assuming the coil 235 to be supplied with a current I, the forces generated by interaction between the current and the magnetic field can be indicated as done by the arrows 240 and 241. The resulting force in FIG. 20a is directed substantially in the X-direction, while the resulting force in FIG. 20b is directed substantially in the Y-direction. Assuming that the magnetic field distribution varies substantially sinusoidal as a function of the Y-position, one can express the force exerted on a current-carrying coil in a magnetic field as depicted in FIG. 19 by the following equation:

$$F_x = Kmx * \sin\left(\frac{\pi y}{d}\right) * i \quad \text{(7)(a) and (b)}$$
$$F_y = Kmy * \cos\left(\frac{\pi y}{d}\right) * i$$

Although equations (7)(a) and (b) are similar to equations (2)(a) and (b), it should be clear that the effect that causes the occurrence of the force component in the X-direction is different for the motor shown in FIG. 12a and the motor as shown in FIGS. 14 to 16. The occurrence of the force component in the X-direction in the motor as depicted in FIGS. 14 to 16 is due to the fact that the direction of the magnetic field varies as a function of both the X-direction and the Y-direction. Due to this, the flux linkage of a coil that is displaced in either the X-direction or the Y-direction, changes, resulting in a force being generated when the coil is provided with a current. For the motor as depicted in FIG. 12a, the occurrence of a resulting force in the X-direction is due to an asymmetric positioning of the coil unit such that the flux linkage of a coil depends on the X-position.

To derive the resulting forces generated when the motor depicted in FIGS. 14 to 16 is supplied from a three-phase power supply, one is referred to equations 3 to 6. With respect to the use of the motor as described, the same consideration can be made as to the motor described in FIG. 12a.

In one example, the motor as introduced in FIGS. 14 to 16 can be applied in a positioning device for positioning an object table such as a chuck provided with a substrate. Such a positioning device can also be obtained by using a linear motor on one side of the movable chuck and a motor as depicted in FIGS. 14 to 16 on the other side.

It should be noted that the motor as depicted in FIGS. 14 to 16 can be easier to assemble than the motor as depicted in FIG. 12a or the motor depicted in FIG. 7 because the motor of FIGS. 14 to 16 only requires a magnet assembly on one side of the coil unit. Due to this, the motor can also be less expensive.

It should further be noted that the motors as depicted in FIGS. 14 to 16 and FIG. 12a only require one (multi-phase) power supply for generating both the required forces in the second and third direction.

Although specific reference can have been made above to the use of embodiments of the invention in the context of lithography, it will be appreciated that the invention can be used in other applications, and where the context allows, is not limited to optical lithography. In particular, it should be noted that the various motors as described can suitably be applied in other applications. The various motors can in general be applied in applications requiring a displacement over comparatively large distances in one direction and comparatively small distances in a direction substantially perpendicular to the direction.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A positioning device for positioning an object table, comprising
    a frame that supports the object table in a first direction; and
    a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction,
    wherein the coil unit is arranged on the object table, such that both the first force and the second force are directed substantially through a center of gravity of the object table.

2. The positioning device of claim 1, wherein:
    the coil unit comprises a plurality of coils arranged adjacent to each other in the second direction; and
    the magnet assembly comprises a single-sided magnet assembly, the single-sided magnet assembly comprising an array of permanent magnets.

3. The positioning device of claim 1, wherein the coil unit is arranged in a plane substantially parallel to the first and the second directions.

4. The positioning device of claim 1, further comprising a second coil unit and a second magnet assembly, the second coil unit and second magnet assembly being arranged on a side of the center of gravity of the object table opposite the first coil unit and first magnet assembly.

5. The positioning device of claims 2, further comprising:
    a multi-phase power supply that supplies a multi-phase current to the two or more coils and a control unit for controlling a commutation angle and amplitude of the multi-phase current.

6. A lithographic apparatus, comprising:
    an illumination system that supplies a beam of radiation;
    a patterning arrangement that patterns the beam;
    a projection system that projects the patterned beam onto a target portion of the substrate; and
    a positioning device that supports a substrate on an object table, comprising,
        a frame that supports the object table in a first direction, and
        a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction, wherein the coil unit is arranged on the object table, such that both the first force and the second force are directed substantially through a center of gravity of the object table.

7. The apparatus of claim 6, wherein the patterning arrangement comprises an array of individually controllable elements.

8. The apparatus of claim 6, wherein the projection system comprises an array of projection elements.

9. The apparatus of claim 6, wherein the projection system and metrology system are mounted on the frame.

10. The apparatus of claim 6, further comprising:
a preconditioning system for thermally preconditioning the substrate.

11. A positioning device for positioning an object table, comprising:
an object table;
a frame that supports the object table in a first direction; and
a coil unit and a magnet assembly, the coil unit cooperating with the magnet assembly to generate a first force on the object table in a second direction substantially perpendicular to the first direction and a second force on the object table in a third direction substantially perpendicular to the first direction and the second direction,
wherein the coil unit comprises a plurality of coils arranged adjacent to each other in the second direction,
wherein the magnet assembly comprises a single-sided magnet assembly, the single-sided magnet assembly comprising an array of permanent magnets, and
wherein the coil unit is arranged on the object table, such that both the first force and the second force are directed substantially through a center of gravity of the object table.

12. A positioning device for positioning an object table, comprising
an object table;
a frame that supports the object table in a first direction; and
a motor that exerts a first force on the object table in a second direction substantially perpendicular to the first direction and a second force on the object table in a third direction substantially perpendicular to the first direction and the second direction, wherein,
a first part of the motor comprises a coil unit of a first motor, the coil unit comprising a plurality of coils arranged adjacent to each other in the second direction, each of the coils comprising two coil sides extending in the third direction and two end turn parts, and
a second part of the motor comprises a magnet assembly of the first motor, the magnet assembly comprising two arrays of permanent magnets arranged on both sides of the coil unit,
the coil unit is arranged asymmetrically between the two arrays of permanent magnets, such that substantially only one of the end turn parts of each coil is arranged in a magnetic field of the two arrays of pennament magnets.

13. A device manufacturing method, comprising
patterning a bean of radiation;
arranging a substrate on an object table;
supporting the object table by a base frame in a first direction;
projecting the patterned beam onto a target portion of the substrate;
generating a first force on the object table in a second direction substantially perpendicular to the first direction and a second force on the object table in a third direction substantially perpendicular to the first direction and the second direction: and
directing the generated first force and the generated second force substantially through a center of gravity of the object table to displace the object table relative to the patterned beam.

14. A positioning device for positioning an object table, comprising
a frame configured to support the object table in a first direction; and
a coil unit arranged to cooperate with a magnet assembly to exert a first force on the object table in a second direction and a second force on the object table in a third direction,
wherein the second direction of the first force and the third direction of the second force pass substantially through a center of gravity of the object table.

15. A positioning device for positioning an object table, comprising
a frame that supports the object table in a first direction; and
a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction,
wherein the coil unit is arranged on the object table, such that both the first force and the second force are directed substantially through a center of gravity of the object table,
wherein the coil unit comprises a plurality of coils arranged adjacent to each other in the second direction, wherein each of the coils comprises two coil sides extending in the third direction and two end turn parts,
wherein the magnet assembly comprises two arrays of permanent magnets arranged on both sides of the coil unit, and
wherein the coil unit is arranged asymmetrically between the two arrays of permanent magnets, such that substantially only one of the end turn parts of each coil is arranged in a magnetic field of the two arrays of permanent magnets.

16. A positioning device for positioning an object table, comprising
a frame that supports the object table in a first direction;
a first coil unit and a first magnet assembly, the first coil unit arranged to cooperate with the first magnet assembly to generate first and second forces exerted on the object table, the first force being exerted on the object table in a second direction substantially perpendicular to the first direction and the second force being exerted on the object table in a third direction substantially perpendicular to the first direction and the second direction,
wherein the first coil unit is arranged on the object table, such that both the first force and the second force are directed substantially through a center of gravity of the object table,
wherein the first coil unit comprises a plurality of coils arranged adjacent to each other in the second direction, wherein each of the coils comprises two coil sides extending in the third direction and two end turn parts, wherein the first magnet assembly comprises two arrays of permanent magnets arranged on both sides of the coil unit, and wherein the first coil unit is arranged asymmetrically between the two arrays of permanent magnets, such that substantially only one of the end turn parts of each coil is arranged in a magnetic field of the two arrays of permanent magnets; and a second coil unit and a second magnet assembly, the second coil unit and second magnet assembly being arranged on a side of the center of gravity of the object table opposite the first coil unit and first magnet assembly.

17. A positioning device for positioning an object table, comprising a frame that supports the object table in a first direction;

a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction, wherein the coil unit is arranged on the object table, such that both the first force and the second force are directed substantially through a center of gravity of the object table, wherein the coil unit comprises a plurality of coils arranged adjacent to each other in the second direction, wherein each of the coils comprises two coil sides extending in the third direction and two end turn parts, wherein the magnet assembly comprises two arrays of permanent magnets arranged on both sides of the coil unit, and wherein the coil unit is arranged asymmetrically between the two arrays of permanent magnets, such that substantially only one of the end turn parts of each coil is arranged in a magnetic field of the two arrays of permanent magnets; and a multi-phase power supply that supplies a multi-phase current to the two or more coils and a control unit for controlling a commutation angle and amplitude of the multi-phase current.

18. A positioning device for positioning an object table, comprising a frame that supports the object table in a first direction; and a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction, wherein the coil unit is arranged on the object table, such that both the first force and the second force are directed substantially through a center of gravity of the object table, wherein the coil unit comprises a plurality of coils and an actuator yoke provided with a coil, wherein the magnet assembly comprises an array of permanent magnets arranged on a ferromagnetic yoke, and wherein the coil and actuator yoke are constructed and arranged to generate a reluctance force between the ferromagnetic yoke and the actuator yoke, the force being directed substantially in the third direction.

19. A positioning device for positioning an object table, comprising a frame that supports the object table in a first direction;

a first coil unit and a first magnet assembly, the first coil unit arranged to cooperate with the first magnet assembly to generate first and second forces exerted on the object table, the first force being exerted on the object table in a second direction substantially perpendicular to the first direction and the second force being exerted on the object table in a third direction substantially perpendicular to the first direction and the second direction, wherein the first coil unit is arranged on the object table, such that both the first force and the second force are directed substantially through a center of gravity of the object table, wherein the first coil unit comprises a plurality of coils and an actuator yoke provided with a coil, wherein the first magnet assembly comprises an array of permanent magnets arranged on a ferromagnetic yoke, and wherein the coil and actuator yoke are constructed and arranged to generate a reluctance force between the ferromagnetic yoke and the actuator yoke, the force being directed substantially in the third direction; and a second coil unit and a second magnet assembly, the second coil unit and second magnet assembly being arranged on a side of the center of gravity of the object table opposite the first coil unit and first magnet assembly.

20. A positioning device for positioning an object table, comprising a frame that supports the object table in a first direction;

a coil unit and a magnet assembly, the coil unit arranged to cooperate with the magnet assembly to generate first and second forces exerted on the object table, the first force being exerted on the object table in a second direction substantially perpendicular to the first direction and the second force being exerted on the object table in a third direction substantially perpendicular to the first direction and the second direction, wherein the coil unit is arranged on the object table, such that both the first force and the second force are directed substantially through a center of gravity of the object table, wherein the coil unit comprises a plurality of coils and an actuator yoke provided with a coil, wherein the magnet assembly comprises an array of permanent magnets arranged on a ferromagnetic yoke, and wherein the coil and actuator yoke are constructed and arranged to generate a reluctance force between the ferromagnetic yoke and the actuator yoke, the force being directed substantially in the third direction; and a multi-phase power supply that supplies a multi-phase current to the two or more coils and a control unit for controlling a commutation angle and amplitude of the multi-phase current.

* * * * *

UNITED STATES PATENT AND TRADEMARK OFFICE
CERTIFICATE OF CORRECTION

PATENT NO. : 7,456,935 B2 Page 1 of 1
APPLICATION NO. : 11/098608
DATED : November 25, 2008
INVENTOR(S) : Cox et al.

It is certified that error appears in the above-identified patent and that said Letters Patent is hereby corrected as shown below:

<u>Column 19</u>
Line 61 please replace "pennanent" with --permanent--.

Signed and Sealed this

Seventeenth Day of February, 2009

JOHN DOLL
*Acting Director of the United States Patent and Trademark Office*